United States Patent
Weingrill et al.

(10) Patent No.: US 12,332,312 B2
(45) Date of Patent: Jun. 17, 2025

(54) TEST METHOD FOR TESTING A DISCONNECTION FUNCTION OF A MAIN SWITCH DEVICE OF AN ELECTRICAL CONNECTION DEVICE OF A FUEL CELL SYSTEM

(71) Applicant: AVL List GmbH, Graz (AT)

(72) Inventors: Katharina Weingrill, Stallhofen (AT); David Weingrill, Stallhofen (AT)

(73) Assignee: AVL List GmbH, Graz (AT)

( * ) Notice: Subject to any disclaimer, the term of this patent is extended or adjusted under 35 U.S.C. 154(b) by 154 days.

(21) Appl. No.: 18/272,142

(22) PCT Filed: Jan. 12, 2022

(86) PCT No.: PCT/AT2022/060007
§ 371 (c)(1),
(2) Date: Jul. 13, 2023

(87) PCT Pub. No.: WO2022/150862
PCT Pub. Date: Jul. 21, 2022

(65) Prior Publication Data
US 2024/0302434 A1  Sep. 12, 2024

(30) Foreign Application Priority Data
Jan. 13, 2021 (AT) .............. A 50009/2021

(51) Int. Cl.
*G01R 31/327* (2006.01)
(52) U.S. Cl.
CPC ................ *G01R 31/3277* (2013.01)
(58) Field of Classification Search
CPC .............. G01R 31/327; G01R 31/3274; G01R 31/3277; G01R 31/3278
See application file for complete search history.

(56) References Cited

U.S. PATENT DOCUMENTS

2012/0081124 A1    4/2012  Kimes et al.
2014/0028322 A1*   1/2014  Tzivanopoulos .. G01R 31/3277
                                                  324/433
(Continued)

FOREIGN PATENT DOCUMENTS

| CN | 106680350 | 5/2017 |
| CN | 109606203 | 6/2020 |
| DE | 102013104629 | 11/2014 |

OTHER PUBLICATIONS

Internationaler Recherchenbericht und Schriftlicher Bescheid [International Search Report and the Written Opinion] Dated Jul. 15, 2022 From the International Searching Authority Re. Application No. PCT/AT2022/060007 and Its Translation of Search Report Into English. (14 Pages).

(Continued)

*Primary Examiner* — Noam Reisner

(57) ABSTRACT

The present invention relates to a test method for testing the disconnection function of a main switch device (110) of an electrical connection device (100) of a fuel cell system (200), the method having the following steps:
- generating a voltage variation (VV) on the low-voltage side (LVS) of a transformer device (120),
- switching a negative main switch (112) of the main switch device (110),
- detecting a voltage difference (VD) between a low voltage (LV) of the low-voltage side (LVS) of the transformer device (120) and a system voltage (SV) of the fuel cell system (200),
- comparing the voltage difference (VD) detected with a zero value (NW).

20 Claims, 9 Drawing Sheets

(56) References Cited

U.S. PATENT DOCUMENTS

2015/0115972 A1\* 4/2015 Park .................... G01R 31/006
 324/503
2017/0271871 A1 9/2017 Lung et al.
2020/0298725 A1\* 9/2020 Shin ................... G01R 31/3275

OTHER PUBLICATIONS

Bal et al. "Naturally Clamped Snubberless Soft-Switching Bidirectional Current-Fed Three-Phase Push-Pull DC/DC Converter for DC Micro-Grid Application", 2015 IEEE Applied Power Electronics Conference and Exposition, APEC, XP032775235, Charlotte, NC, USA, Mar. 15-19 p. 717-724, Mar. 15, 2015.

Kan et al. "Voltage-Fed Dual Active Bridge Bidirectional DC/DC Converter With An Immittance Network", IEEE Transactions on Power Electronics, XP011540371, 29(7): 3582-3590, Jul. 1, 2014.

\* cited by examiner

TEST METHOD FOR TESTING A DISCONNECTION FUNCTION OF A MAIN SWITCH DEVICE OF AN ELECTRICAL CONNECTION DEVICE OF A FUEL CELL SYSTEM

RELATED APPLICATIONS

This application is a National Phase of PCT Patent Application No. PCT/AT2022/060007 having International filing date of Jan. 12, 2022, which claims the benefit of priority of Austrian Patent Application No. A50009/2021 filed on Jan. 13, 2021. The contents of the above applications are all incorporated by reference as if fully set forth herein in their entirety.

FIELD AND BACKGROUND OF THE INVENTION

The present invention relates to a test method for testing the disconnection function of a main switch device of an electrical connection device of a fuel cell system, a computer program product comprising commands for carrying out such a method on a computer and a test device for testing the disconnection function of a main switch device of an electrical connection device of a fuel cell system.

It is known that fuel cell systems are used for the local generation of electrical power. In order to further distribute the generated electricity in startup operation, normal operation or shutdown operation, electrical connection devices are usually provided which pass on the generated electrical energy to corresponding electrical consumers. This can be a connected electrical network or decentralised electrical consumers, for example mobile electric motors. It is also known that, in order to create an electrically secured state when fuel cell systems are switched off, a main switch device is provided to disconnect the electrical load and/or the electrical network from the fuel cell system electrically. Such known main switch devices are usually equipped with two main switches, namely a negative main switch for the negative pole and a positive main switch for the positive pole of the fuel cell system.

A disadvantage of the known solutions is that the effort required to check the functionality of the main switch device is relatively high.

SUMMARY OF THE INVENTION

It is the object of the present invention to remedy, at least partially, the disadvantages described above. In particular, it is the object of the present invention to detect a defective disconnection function of such a main switch device in a cost-effective and simple manner.

The above problem is solved by a test method with the features of claim 1, a computer program product with the features of claim 11 and a test device with the features of claim 12. Further features and details of the invention are disclosed in the dependent claims, the description and the drawings. Naturally, features and details described in connection with the test method according to the invention also apply in connection with the computer program product according to the invention and the test device according to the invention and vice versa, so that, with regard to disclosure, mutual reference is or can always be made to the individual aspects of the invention.

The core idea according to the invention is a test method for testing the disconnection function of a main switch device of an electrical connection device of a fuel cell system. Such a test method has the following steps:
generating a voltage variation on the low-voltage side of a transformer device,
switching a negative main switch of the main switch device,
detecting a voltage difference between a low voltage of the low-voltage side of the transformer device and a system voltage of the fuel cell system,
comparing the voltage difference detected with a zero value.

According to the invention, a test method is suggested which can be carried out on the basis of existing system information. Usually, a voltage monitoring is arranged both on the output side of the fuel cell system and on the low-voltage side of the downstream transformer device. During normal operation, it is ensured in this way which output voltage is currently provided by the fuel cell system in this operating situation and which input voltage is supplied to the downstream transformer device. This can be used to monitor the fuel cell system and/or to monitor the transformer device. According to the invention, this voltage information is now used in an additional way through a defined switching sequence in the main switch device.

According to the invention, it now becomes possible to switch the main switch device with a time delay, i.e., in particular, initially only to switch the negative main switch. It should be noted that a test method according to the invention can be carried out in an identical manner both for startup operation, i.e. when the main switch device is switched on, and for shutdown operation, i.e. when the main switch device is switched off. However, the evaluation differs between startup operation and shutdown operation.

In a test method according to the invention, in a first step a voltage variation is deliberately generated on the low-voltage side of a transformer device. This voltage variation can also be described as a test voltage variation, because it would not occur in normal operation, but is actively introduced into the low-voltage side of the transformer device. This can for example be achieved in that a corresponding change in the low voltage on the low-voltage side of the transformer device is generated from the high-voltage side of the transformer device, by a separate power supply or also through a variation in the mode of operation of the fuel cell system in shutdown operation. As soon as this voltage variation has been provided, the negative main switch of the main switch device is then switched.

Switching one of the two main switches is to be understood as meaning a switching-over of the switching state. During startup operation, the negative main switch is moved from the open position to the closed position, while during shutdown operation, in a test method according to the invention a closed negative main switch is switched to its open position in this step. Switching the negative main switch and thus changing the switching state of this negative main switch leads to one pole of the electrical connection device being switched on in startup operation and one pole of the main switch device being switched off during shutdown operation. The switching of the negative main switch thus means that in both cases, i.e. both in startup operation and in shutdown operation, only one of the two electrical conductors establishes a connection between the fuel cell system and the transformer device.

In this situation, if the disconnection function of the two main switches is functional, this means that the other main switch will remain in its previous switching position. In startup operation, both main switches are switched off before the method according to the invention, so that the negative main switch is switched on and the positive main switch is switched off. In such a case, switching on the negative main switch does not cause any change in the electrical connection situation, so that the imposed voltage variation remains. In such a case during startup operation, a voltage difference thus becomes recognisable between the low voltage with the applied voltage variation on the low-voltage side of the transformer device and a system voltage of the fuel cell system that is still at zero.

If no voltage difference can be detected here, the reason can only be that, undesirably, the positive main switch does not provide any disconnection function, but is in fact, unexpectedly, already in a closed situation. In this case, switching the negative main switch causes a complete closure of the electrical connection between the fuel cell system and the transformer device, which in turn leads to a voltage equalisation, so that a zero value is registered as the voltage difference.

In shutdown operation, a test method according to the invention starts out with closed main switches. The change in the switching position of the negative main switch thus leads to the opening of this negative main switch, so that only the positive main switch now remains in the closed switching state. If the disconnection function is functional, this means that the imposed voltage difference remains, since no voltage equalisation can take place due to the open negative main switch. However, if the opening of the negative main switch is not successful, for example due to undesired adhesion or welding of the negative main switch, then the electrically conductive connection between the fuel cell system and the transformer device remains, a voltage equalisation can take place and the zero value is detected as the voltage difference.

In both cases, i.e. in startup operation as well as in shutdown operation, a comparison of a detected voltage difference with a zero value will provide a result as to whether or not the disconnection function is functioning. If the zero value is detected as the voltage difference, this corresponds to a fault in the two versions described, i.e. a loss of the disconnection function of the negative main switch and/or the positive main switch (in startup operation). If the voltage difference is detected as a value different from the zero value, then a functional disconnection function can be assumed.

In contrast to known solutions in which such a test functionality had to be provided by separate components, a test method according to the invention can be used cost-effectively and simply on the low-voltage side of the transformer device.

In particular, use can be made of existing voltage information from the fuel cell system and the low-voltage side of the transformer device. A further advantage of a test method according to the invention is that, in its basic concept, it can be used for both startup operation and shutdown operation. It can thus be carried out, without new hardware, for the special operating situations of switching on and switching off using an identical evaluation possibility in the form of comparing the detected voltage difference with a zero value.

It should also be noted that, within the meaning of the present invention, a zero value for the voltage difference represents in particular 0 volts or substantially 0 volts. However, in principle, a different base value can also be understood as zero value within the meaning of the present invention, which may in particular be greater than 0 volts.

In a test method according to the invention, the transformer device is in particular designed as a DC/DC converter which is able to transform the low voltage of the fuel cell system into a high voltage of a downstream consumer and/or electrical network.

It can bring advantages if, in a test method according to the invention, in a startup operation of the fuel cell system the voltage variation is generated by charging the low-voltage side of the transformer device, in particular from a high-voltage side of the transformer device and/or by means of a low-voltage supply of the transformer device. This is to be understood in particular as the startup operation of a method according to the invention, and a so-called pre-charge state is achievable. It is possible to pre-charge the low-voltage side from the high-voltage side, i.e. from a battery device arranged there, a corresponding compensator device or an electrical network for example, by means of a reverse transformation by a bidirectionally acting transformer device and in this way to provide a surplus voltage for the desired necessary voltage variation. In startup operation, a zero value of 0 volts is assumed on the low-voltage side. The use of a separate low-voltage supply is particularly expedient either if no voltage is present on the high-voltage side when the fuel cell system is switched off or if the voltage on this side is not sufficient for the required voltage variation. Especially if the transformer device also has its own power supply for regular operation, this power supply can be used for the voltage variation in accordance with the invention.

It can bring advantages if, in a test method according to the invention, the voltage variation takes place from a zero value. This too takes place in particular during startup operation, whereby this zero value is in particular an identical zero value to that used for the comparison step of the test method according to the invention. The voltage variation therefore takes place in particular from 0 volts or substantially 0 volts.

It is also advantageous if, in a test method according to the invention, during a shutdown operation of the fuel cell system the voltage variation is generated by a shutdown of the power generation by the fuel cell system, in particular by reducing or shutting off a gas supply to the fuel cell system. While in startup operation a voltage variation can be achieved through external supply and thus a voltage increase, a shutdown operation will start out from a normal regular mode of operation of the fuel cell system. Thus, shutdown operation, both in the form of a formal shutdown and in the form of an emergency shutdown, starts out from a corresponding system voltage which is not equal to 0 volts. In order to achieve the voltage variation, the mode of operation of the fuel cell system can for example be changed here so that the output voltage of the fuel cell system decreases as a result, in particular by reducing or shutting off the gas supply. In particular, the air supply can be reduced or even completely shut off, so that fuel cell operation in the fuel cell system comes to a standstill for a certain shutdown period. During these shutdown processes, the system voltage of the fuel cell system decreases, so that when the main switch device is completely switched on, the low voltage on the low-voltage side of the transformer device also decreases. This voltage variation is therefore no longer based on the zero value, but on a base value in the form of the operating voltage of the system voltage. However, the test method and the test result correspond to the basic procedure in startup operation.

It can bring advantages if, in a test method according to the invention, the switching position of a positive main switch of the main switch device is maintained for a switching offset period after switching the negative main switch.

This switching offset period can also be referred to as the test period and can, for example, be about 20 ms. In particular, the switching offset period is long enough to carry out the test method according to the invention and short enough to quickly provide an electrical connection to the electrical connection device in the event of a fault-free disconnection functionality. The switching offset period can therefore be understood as a test time or safety time. This switching offset period is in particular identical or substantially identical for startup operation and shutdown operation.

It also brings advantages if, in a test method according to the invention, a fault is detected at a detected voltage difference that corresponds to or substantially corresponds to the zero value. As has already been explained above, a method according to the invention is designed to detect a fault in the absence of a voltage difference. This preferably applies to both shutdown operation and startup operation. If, despite voltage variation in startup operation, no voltage difference is detected on changing the switching state in the form of switching on the negative main switch, the reason can only be that the positive switch is, undesirably, also in the switched-on switching state. Since startup operation starts out from a switched-off fuel cell system, this can only result from a defective disconnection function of the positive main switch. In shutdown operation, an active change in the switching state of the negative main switch necessarily leads to a voltage difference that is not equal to the zero value. Only if the negative main switch cannot be changed because its switching functionality is defective is the electrically conductive connection maintained, and nor does the voltage variation lead to a voltage difference. Such a detected fault can either be output, generate a fault signal for further use and/or influence the operation of the fuel cell system, the main switch device itself and/or the transformer device directly during the course of the test method.

It can also be advantageous if, in a test method according to the previous paragraph, a switching of a positive main switch of the main switch device is suppressed if a fault is detected during a startup operation. That is to say, if it were detected that in startup operation the positive main switch does not have the desired disconnection function due to welding, active positive switching is no longer necessary here. In particular, in this case the negative main switch is also opened again in order to avoid an undesired regular operation which can only be shut down to a limited extent due to the defective disconnection function of the positive main switch.

It can also bring advantages if, in a test method according to the invention, the positive main switch is switched if a fault is detected in a shutdown operation. In shutdown operation, the fuel cell system is in operation and needs to be deactivated. The fault here corresponds to a welded and/or defective negative main switch, so that electrical disconnection can only be guaranteed by switching off the positive main switch. Preferably, this fault leads not only to the output of the fault signal and/or the fault information, but also, in particular, to a suppression of a restart of the fuel cell system until the defective disconnection function of the negative main switch has been remedied.

It is also advantageous if, in a test method according to the invention, if a fault is detected, the operation of the fuel cell system is adjusted, in particular as follows:
in startup operation, a termination of startup operation of the fuel cell system,
in shutdown operation, an electrically protected shutdown of the fuel cell system,
after a shutdown operation, preventing the fuel cell system from restarting.

The above list is non-exhaustive. In particular, the individual reactions are immediate reactions of the fuel cell system. If a fault is detected during startup operation through a defective disconnection function of the positive main switch, startup operation can be terminated immediately in order to avoid a regular operating state of the fuel cell system being reached in the event of a defective disconnection function of the main switch device. In shutdown operation, a secure and electrically protected shutdown must be ensured so that, for example in an emergency shutdown operation, the electrical mode of operation is adapted in the event of a defective main switch device in order to avoid overheating or electrical short circuits. As soon as the operating situation of the fuel cell system has been secured after shutdown operation when a fault has been detected, a restart of the fuel cell system can be blocked.

It is also advantageous if, in a method according to the invention, an insulation check is carried out after comparing the detected voltage difference, especially if a fault is detected. Such an insulation check can be integrated into a test device and detect insulation faults, especially during startup operation. Due to the fact that, as a result of the delayed switching possibility of the main switch of the main switch device, there is an electrically conductive partial connection via the closed negative main switch, an insulation tester on the side of the transformer device can already carry out an insulation test at this time. Another object of the present invention is a computer program product comprising commands which, when the program is run by a computer, cause the computer to carry out a method according to the present invention. Thus, a computer program product according to the invention brings with it the same advantages as have been explained in detail with reference to a method according to the invention.

A further object of the present invention is a test device for testing the disconnection function of a main switch device of an electrical connection device of a fuel cell system. Such a test device has a generating module for a generating a voltage variation on the low-voltage side of a transformer device. A switching module is also provided for connecting a negative main switch of the main switch device. A detection module is used to detect a voltage difference between a low voltage of the low-voltage side of the transformer device and a system voltage of the fuel cell system. A comparison of the recorded voltage difference with a zero value can be carried out with the aid of a comparison module. The generating module, the switching module, the detection module and/or the comparison module are in particular designed to carry out a method according to the invention. Thus, a test device according to the invention has the same advantages as have been explained in detail with reference to a method according to the invention.

It is also advantageous if, in a test device according to the invention, this has an insulation testing module for an insulation test of the fuel cell system. As has been explained with reference to the test method, an insulation test can thus be integrated into the testing of the disconnection function according to the present invention.

BRIEF DESCRIPTION OF THE SEVERAL VIEWS OF THE DRAWINGS

Further advantages, features and details of the invention are explained in the following description, in which embodiments of the invention are described in detail with reference to the drawings. In each case schematically.

DESCRIPTION OF SPECIFIC EMBODIMENTS OF THE INVENTION

Figure 1:
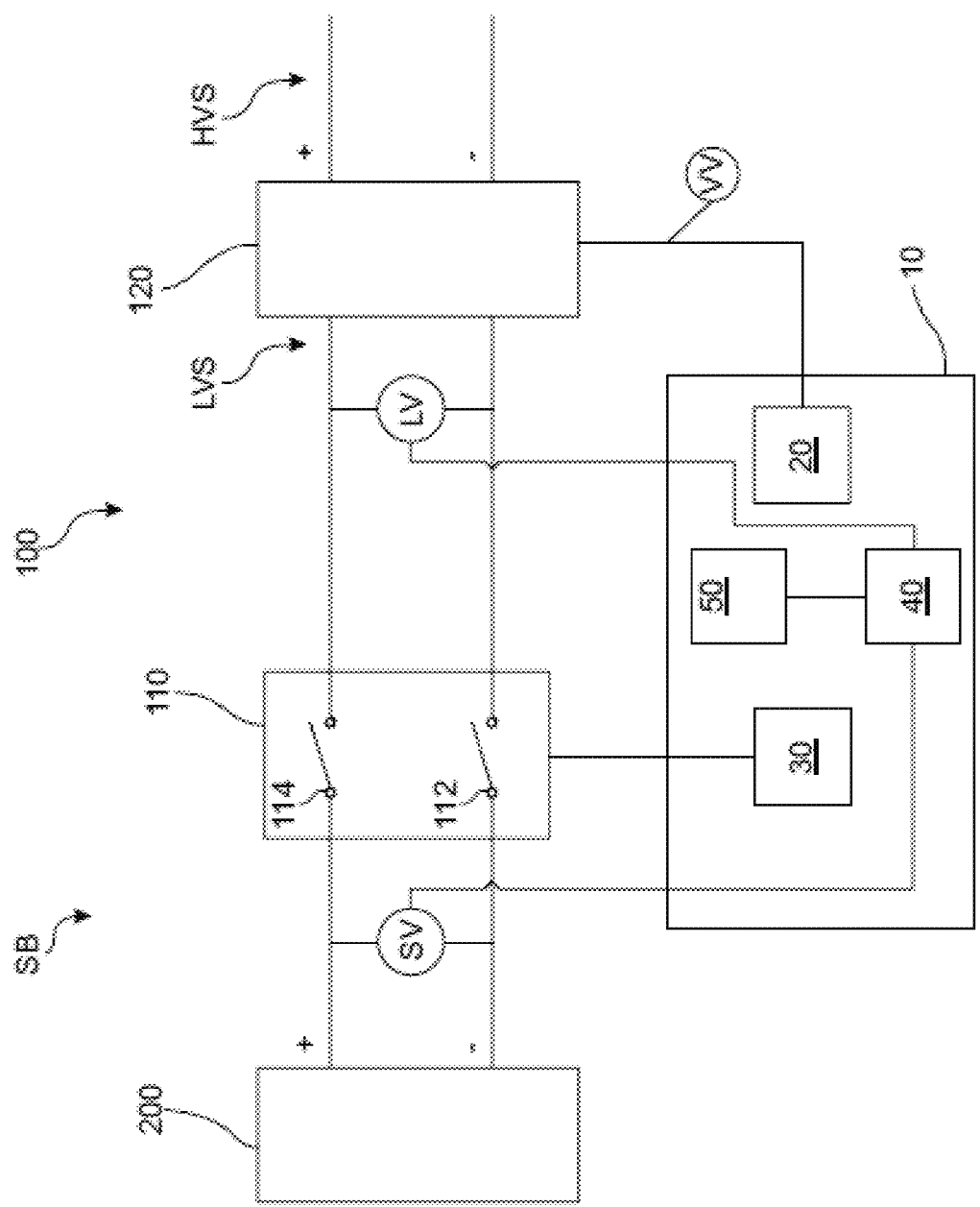
FIG. 1 shows an embodiment of a method according to the invention.

FIG. 1 shows, schematically, an embodiment of a test device 10 according to the invention. This is used to test the disconnection function of the main switch device 110, which is integrated into the electrically conductive connection 100 between a fuel cell system 200 and an electrical load or an electrical network, not shown in detail. The electrical connection device 100 is also equipped here with a transformer device 120. The transformer device 120 transforms between a low voltage LV and a high voltage on the high-voltage side HVS. The connection between the transformer device 120 and the fuel cell system 200 is provided on the low-voltage side LVS of the transformer device 120 and can be switched via the negative main switch 112 and the positive main switch 114 of the main switch device 110.

Figure 2:
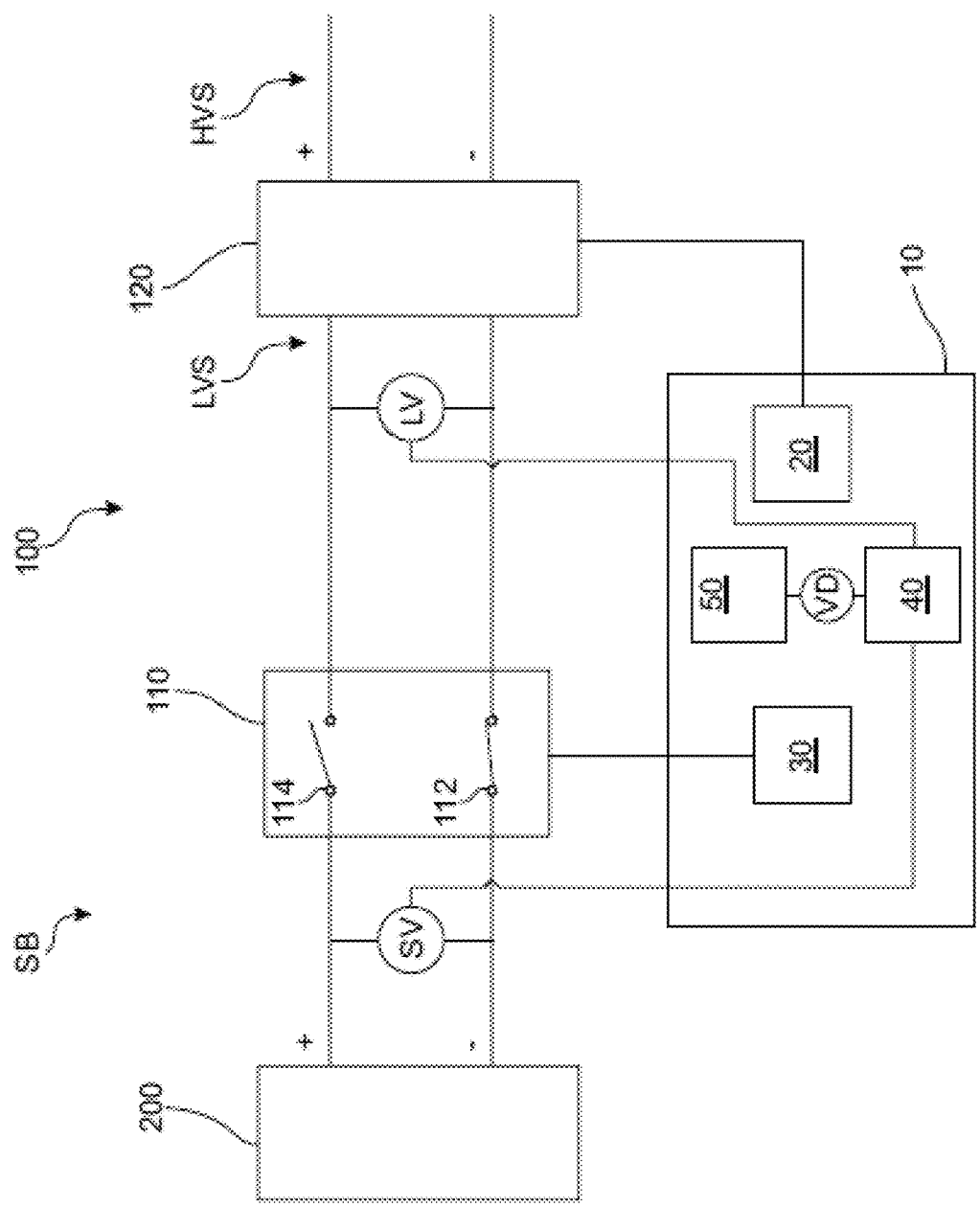
FIG. 2 shows the next step of a method according to the invention.
Figure 3:
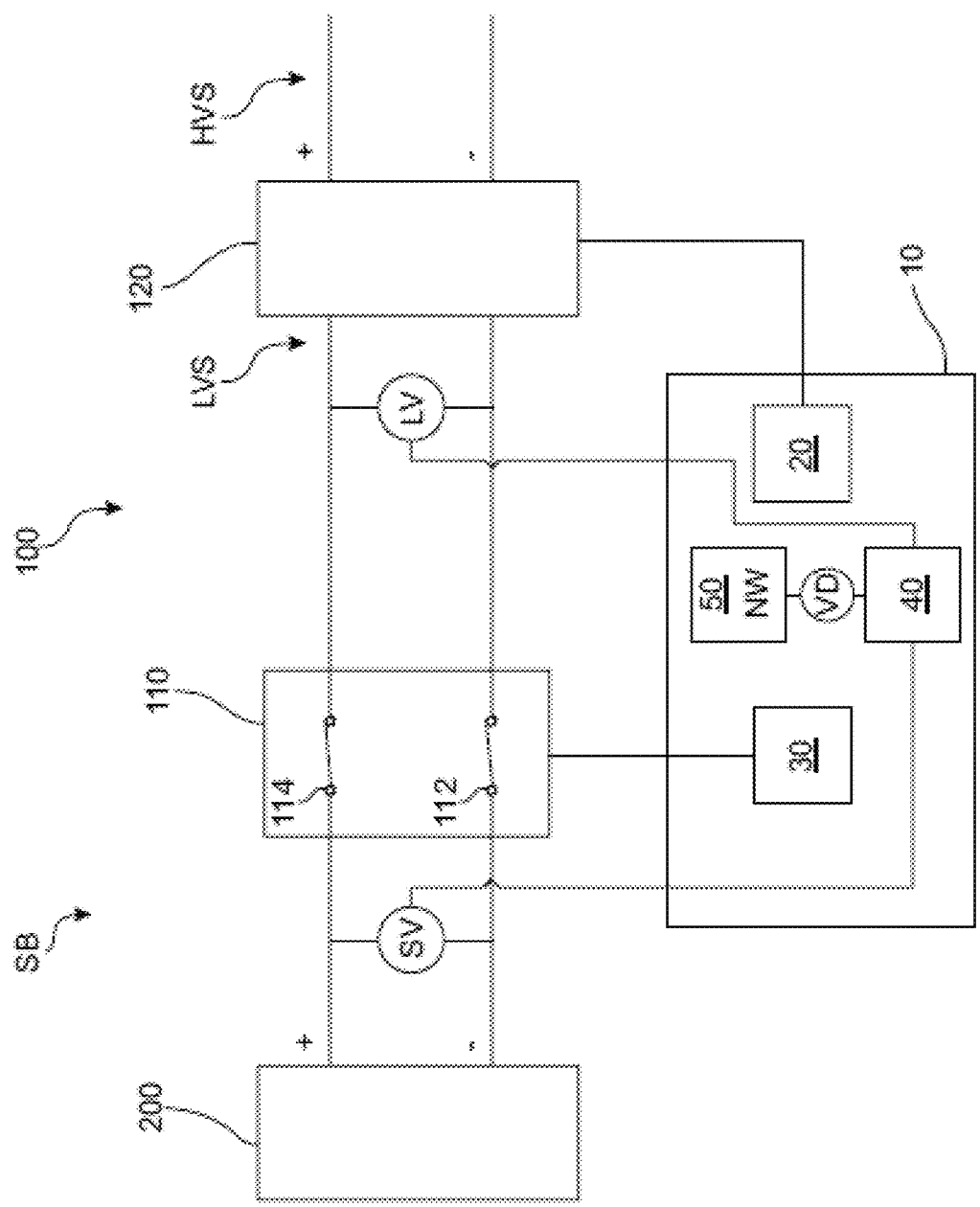
FIG. 3 shows the next step of a method according to the invention.

FIGS. 1 to 3 represent a startup operation SB. Thus, the test method begins with a voltage variation VV being imposed on the low-voltage side LVS of the transformer device 120. According to FIG. 1, this is done from the high-voltage side HVS. In the next step, as shown in FIG. 2, the negative main switch 112 is closed and the voltage difference VD between the system voltage SV and the low voltage LV on the low-voltage side LVS of the transformer device 120 is detected. In the next step, this measured voltage difference VD is now compared with a zero value NW, so that in the event of proper functioning a voltage difference VD is present which is not equal to the zero value NW and the positive main switch 114 can also be closed. This corresponds to the normal case with a fully functional disconnection function of the main switch device 110, and FIG. 3 shows the switched-on situation, which following startup operation SB can now transfer the fuel cell system 200 into regular operation.

Figure 4:
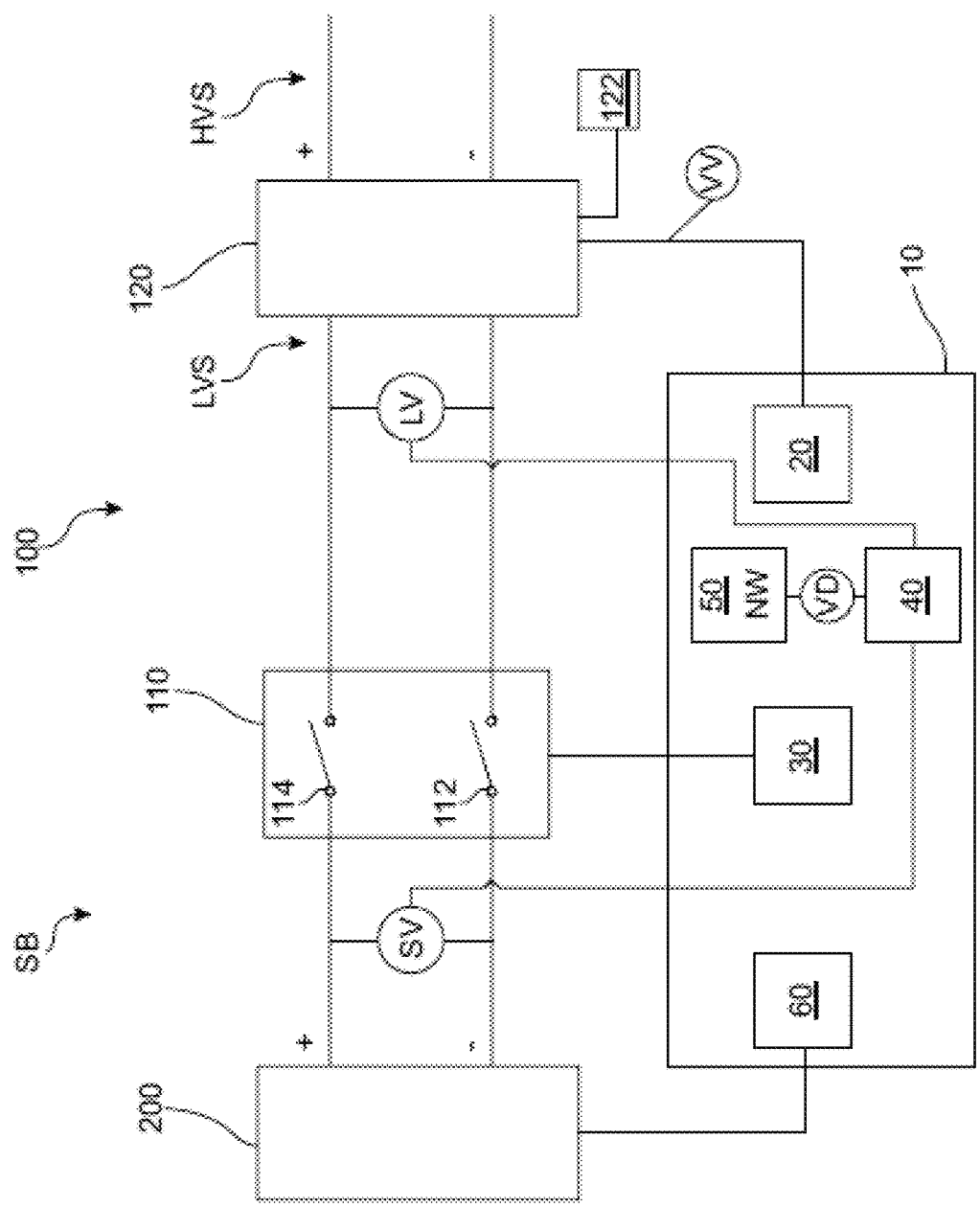
FIG. 4 shows an alternative embodiment of a method according to the invention of a test device according to the invention.

FIG. 4 shows a variation in which the voltage variation VV is not introduced from the high-voltage side HVS, but from a low-voltage supply 122 of the transformer device 120. The functionality of the main switch device 110 is otherwise preferably identical to the description of FIGS. 1 to 3. In this embodiment shown in FIG. 4, the test device 10 is additionally equipped with an insulation testing module 60 which is able to carry out an insulation test of the fuel cell system 200.

Figure 5:
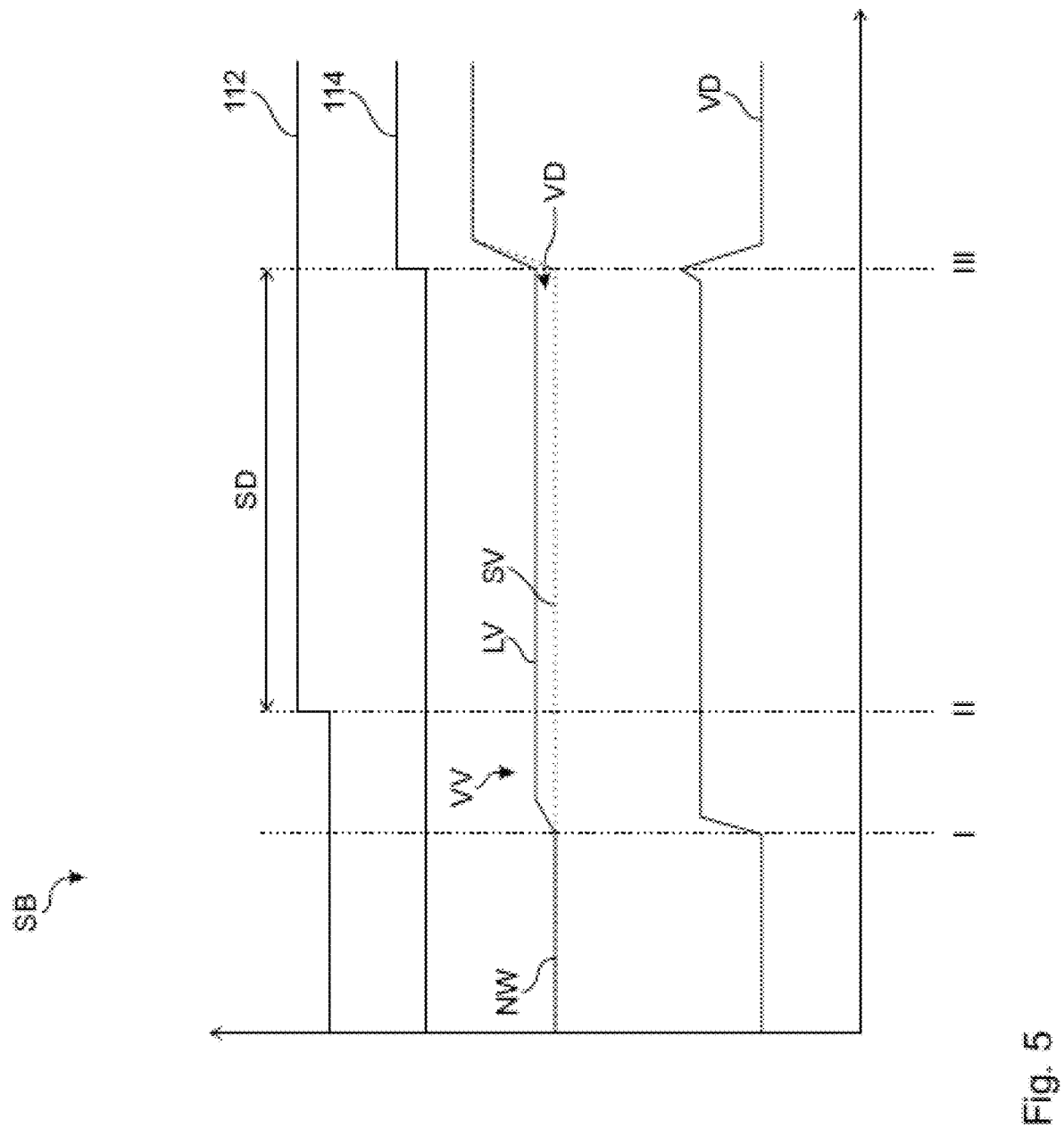
FIG. 5 shows the individual procedures in a startup operation.

FIG. 5 shows the individual switching and voltage curves for startup operation SB according to FIGS. 1 to 3. In the uppermost representation, the switching situation of the negative main switch 112 runs from left to right over the time axis, and below it the switching situation of the positive main switch 114. The two switching curves are represented qualitatively here between a lower value which corresponds to the switched-off state and an upper value which corresponds to the switched-on state. Below this is the voltage curve of the low voltage LV and the system voltage SV as well as, finally, in the bottom line, the voltage difference VD. If a fuel cell system 200 is now transferred into startup operation SB, both main switches 112 and 114 are still switched off. At time I, a voltage variation VV is generated in that a precharging takes place on the low-voltage side LVS, for example from the high-voltage side HVS. Between time I and II, this is apparent in that an increase in the low voltage LV occurs. Normally, i.e. if, with a functioning disconnection function, the positive main switch 114 provides the disconnect function when switched off, a voltage equalisation is excluded, so that the system voltage SV remains at zero value NW until time II and also until time III, i.e. also after the negative main switch 112 has been switched on. The voltage difference VD thus increases at time I and only decreases again when a voltage equalisation can take place. If the disconnection function is functional, this is only possible if the positive main switch 114 can also be switched off at time III. At this point, the voltage difference VD drops again and the regular operation of the fuel cell system 200 can start.

Figure 6:
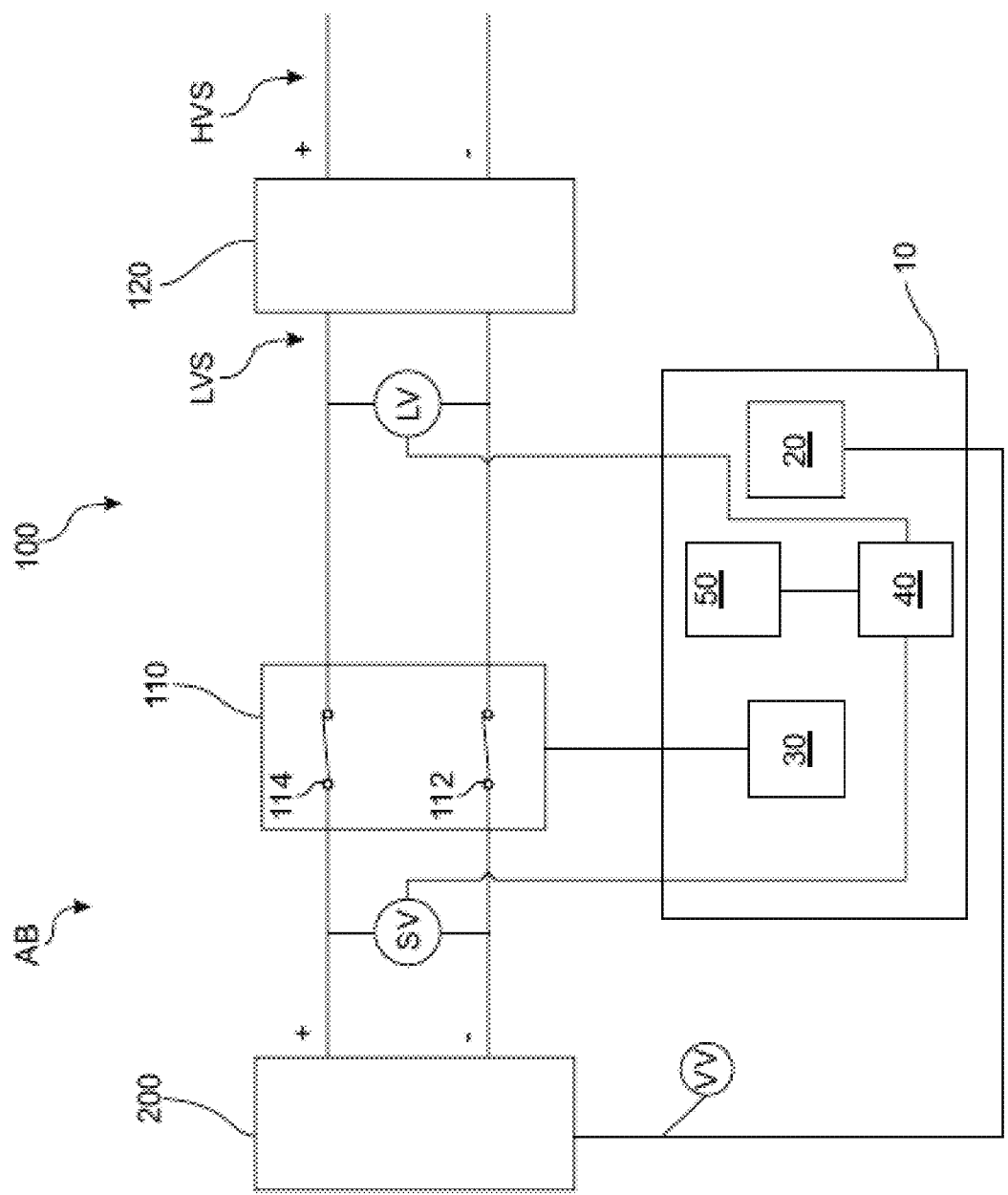
FIG. 6 shows the embodiment of FIGS. 1 to 3 in shutdown operation.
Figure 7:
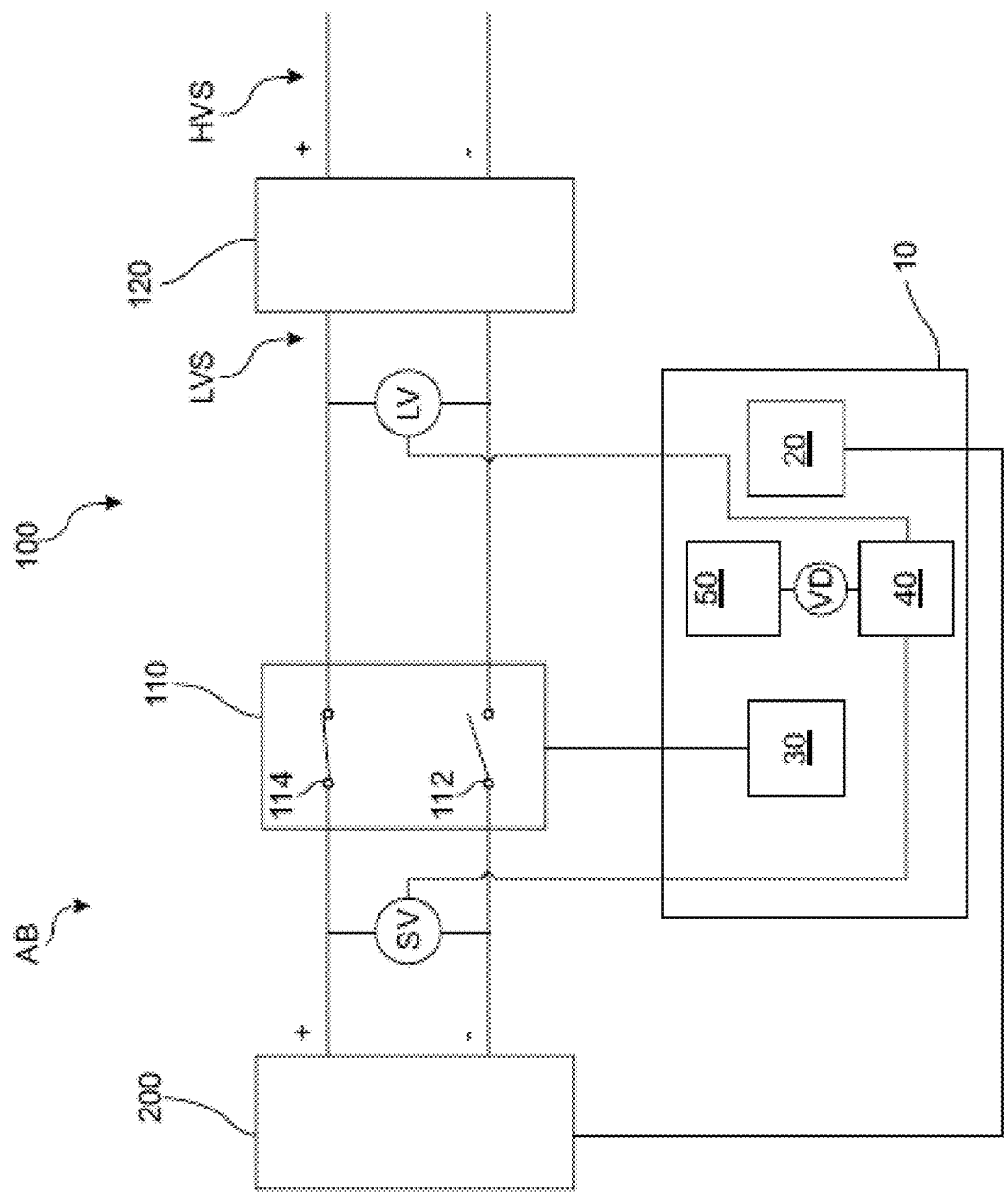
FIG. 7 shows the next step of a method according to the invention in shutdown operation.
Figure 8:
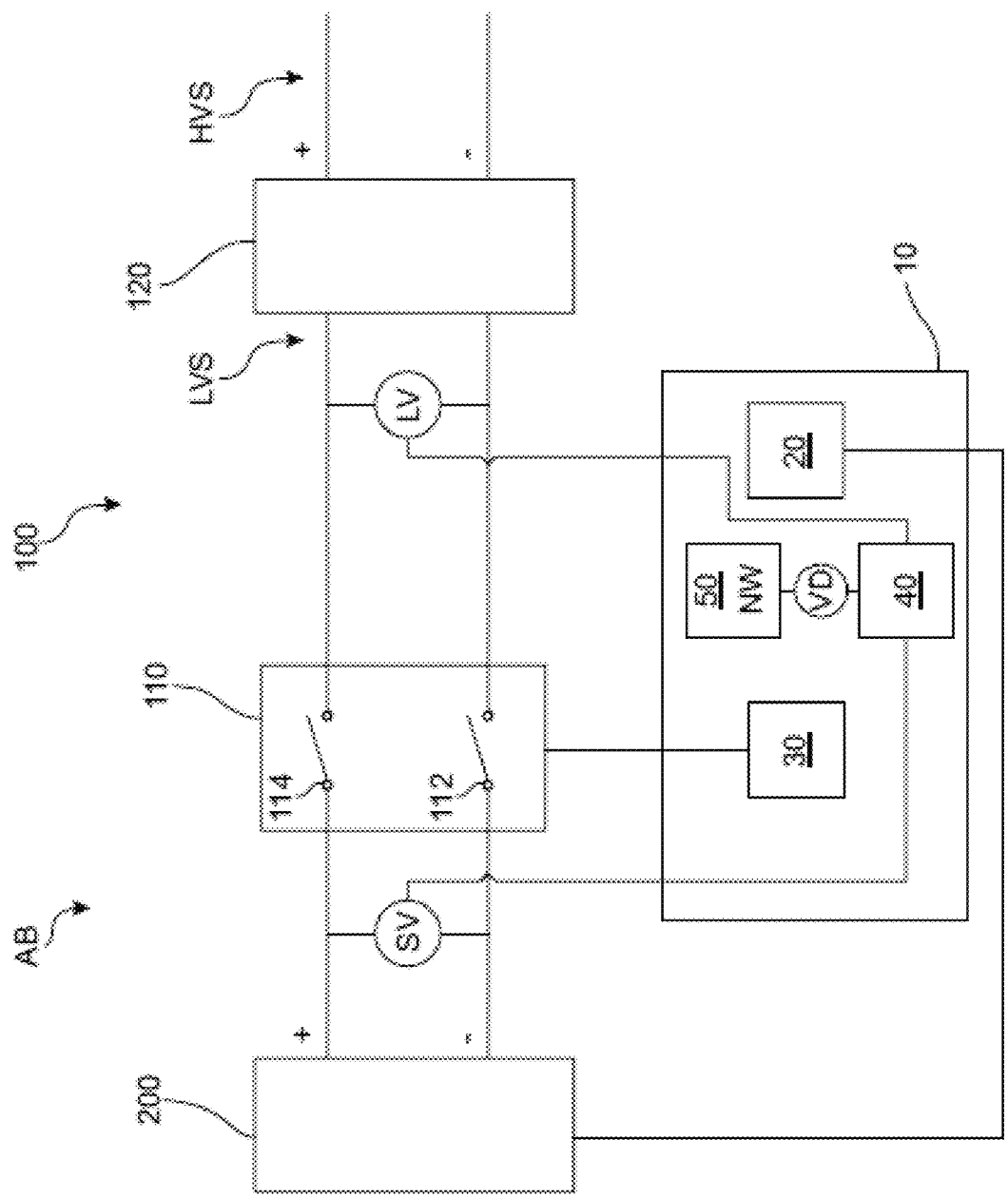
FIG. 8 shows the next step of a method according to the invention in shutdown operation.

FIGS. 6, 7 and 8 show shutdown operation AB of an embodiment of a test device 10. Starting out from a regular operation of the fuel cell system 200, a voltage variation VV is now generated, for example by changing the mode of operation of the fuel cell system 200. This leads, for example, to a drop in the system voltage SV by shutting off or reducing the air supply in the fuel cell system 200. As long as the two main switches 112 and 114 are in the closed state shown in FIG. 6, there is an equalisation between the low voltage LV and system voltage SV and both voltages decrease to the same extent as a result of the voltage variation VV. In FIG. 7, after the introduced and continuing voltage variation VV, in shutdown operation AB too the negative main switch 112 is now first opened again. If the disconnection function of this negative main switch 112 is functional, this prevents voltage equalisation, as will be explained in more detail later with reference to FIG. 9. If, at this point in time in FIG. 7, a voltage difference can be perceived, a functional disconnection function of the negative main switch 112 can be assumed, shutdown operation AB can be continued and the positive main switch 114 can be opened.

Figure 9:
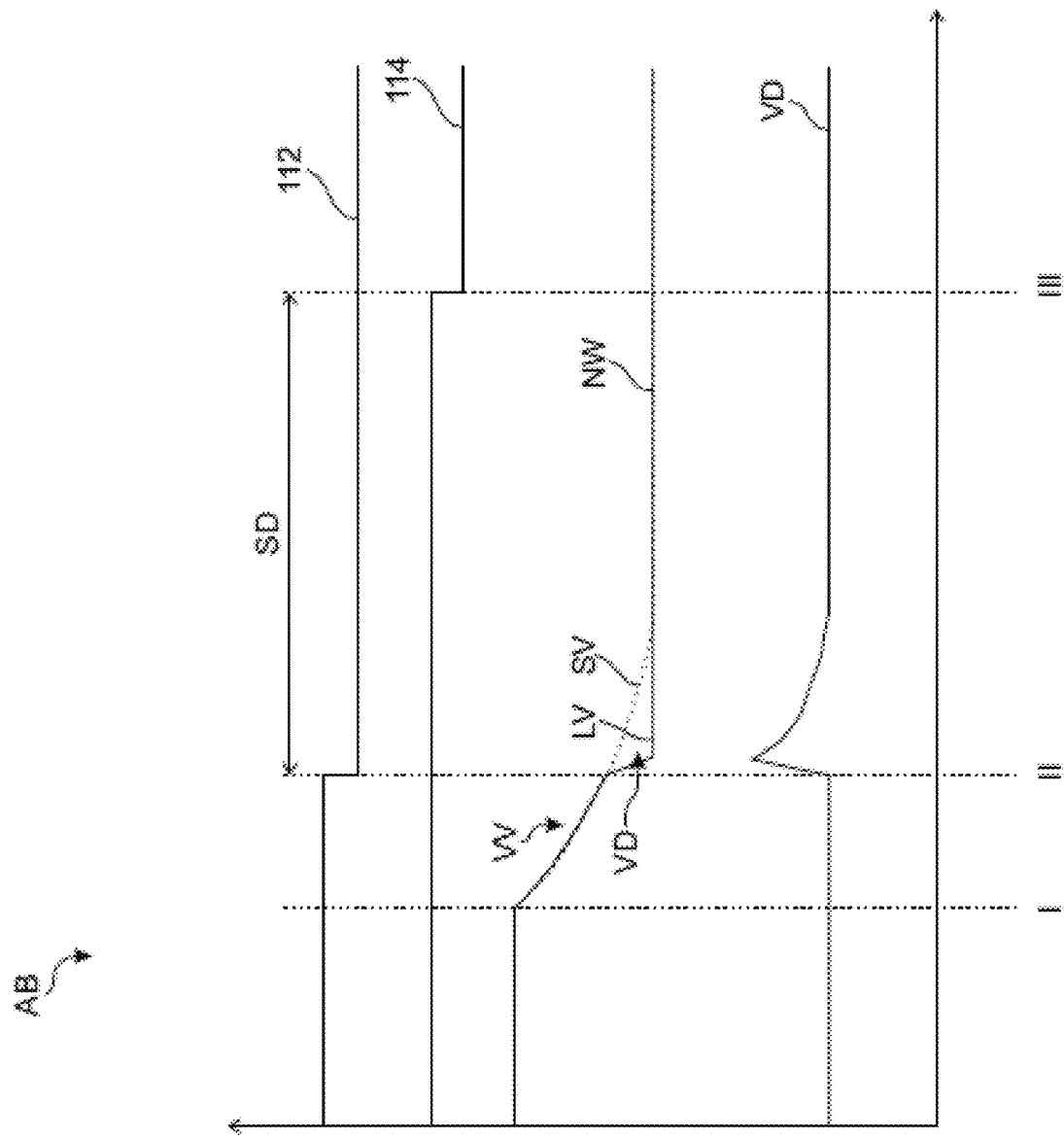
FIG. 9 shows the individual procedures in shutdown operation.

FIG. 9 shows the individual voltage and switching curves of the embodiments shown in FIGS. 6, 7 and 8. Here, the shutdown mode AB starts out from a regular operation of the fuel cell system 200, i.e. both main switches 112 and 114 are switched on. At time I, the voltage variation VV is achieved here by reducing the air supply to the fuel cell system 200. The system voltage SV and the low voltage LV decrease together up to time II. At this time II, the negative main switch 112 is switched off, so that voltage equalisation can no longer take place and the low voltage LV drops sharply, while at the same time the system voltage SV undergoes a slow decrease, as can be seen to the right of time II. This results in a voltage difference VD, which is plotted separately in the lowest line of FIG. 9 until an equalisation of the low voltage LV and the system voltage SV can be provided again. At time III, especially if a voltage difference VD greater than the zero value NW has previously been detected, the positive main switch 114 can be switched off completely, so that the fuel cell system 200 has been shut down.

In FIGS. 5 and 9 it can also clearly be seen that there is a switching offset period SD between the switching times II and III. This is for example chosen in the range of 20 ms in order to ensure that the test method according to the invention, in particular the detection and comparison steps of the test method, are given sufficient time to be carried out.

The above explanation of the embodiments describes the present invention exclusively in the context of examples. Naturally, individual features of the embodiments can, if technically expedient, be freely combined with each other without departing from the scope of the present invention.

LIST OF REFERENCE SIGNS

10 test device
20 generating module
30 switching module
40 detection module
50 comparison module
60 insulation testing module
100 electrical connection device
110 main switch device
112 negative main switch
114 positive main switch
120 transformer device
122 low-voltage supply
200 fuel cell system
HVS high-voltage side
LVS low-voltage side
LV low voltage
SV system voltage
VV voltage variation
VD voltage difference
NW zero value
SD switching offset period
SB startup operation
AB shutdown operation

What is claimed is:

1. Test method for testing the disconnection function of a main switch device of an electrical connection device of a fuel cell system, having the following steps:
generating a voltage variation on the low-voltage side of a transformer device,
switching a negative main switch of the main switch device,
detecting a voltage difference between a low voltage of the low-voltage side of the transformer device and a system voltage of the fuel cell system,
comparing the voltage difference detected with a zero value.

2. Test method according to claim 1, wherein, during a startup operation of the fuel cell system (200), the voltage variation is generated by charging the low-voltage side of the transformer device, in particular from a high-voltage side of the transformer device and/or by means of a low-voltage supply of the transformer device.

3. Test method according to claim 2, wherein the voltage variation is based on a zero value.

4. Test method according to claim 1, wherein, during a shutdown operation of the fuel cell system, the voltage variation is generated by a shutdown of the power generation by the fuel cell system, in particular by reducing or shutting off a gas supply to the fuel cell system.

5. Test method according to claim 1, wherein the switching position of a positive main switch of the main switch device is maintained for a switching offset period after switching the negative main switch.

6. Test method according to claim 1, wherein a fault is detected if a voltage difference is detected which corresponds to or substantially corresponds to the zero value.

7. Test method according to claim 6, wherein, if a fault is detected during a startup operation, a switching of a positive main switch of the main switch device is suppressed.

8. Test method according to claim 6, wherein, if a fault is detected during a shutdown operation, the positive main switch is switched.

9. Test method according to claim 6, wherein, if a fault is detected, the operation of the fuel cell system is adjusted, in particular as follows:
In startup operation, a termination of startup operation of the fuel cell system;
In shutdown operation, an electrically protected shutdown of the fuel cell system;
After a shutdown operation, preventing the fuel cell system from restarting.

10. Test method according to claim 1, wherein an insulation check is carried out after comparing the voltage difference detected, especially if a fault is detected.

11. Computer program product comprising commands which, when the program is run by a computer, cause this to carry out a method with the features of claim 1.

12. Test device for testing the disconnection function of a main switch device of an electrical connection device of a fuel cell system, having a generating module for a generating a voltage variation on the low-voltage side of a transformer device, a switching module for switching a negative main switch of the main switch device, a detection module for detecting a voltage difference between a low voltage of the low-voltage side of the transformer device and a system voltage of the fuel cell system and a comparison module for comparing the voltage difference detected with a zero value.

13. Test device according to claim 12, wherein this has an insulation testing module for performing an insulation test of the fuel cell system.

14. Test device according to claim 12, wherein, during a startup operation of the fuel cell system (200), the voltage variation is generated by charging the low-voltage side of the transformer device, in particular from a high-voltage side of the transformer device and/or by means of a low-voltage supply of the transformer device.

15. Test device according to claim 12, wherein the voltage variation is based on a zero value.

16. Test device according to claim 12, wherein, during a shutdown operation of the fuel cell system, the voltage variation is generated by a shutdown of the power generation by the fuel cell system, in particular by reducing or shutting off a gas supply to the fuel cell system.

17. Test device according to claim 12, wherein the switching position of a positive main switch of the main switch device is maintained for a switching offset period after switching the negative main switch.

18. Test device according to claim 12, wherein a fault is detected if a voltage difference is detected which corresponds to or substantially corresponds to the zero value.

19. Test device according to claim 18, wherein, if a fault is detected during a startup operation, a switching of a positive main switch of the main switch device is suppressed and/or if a fault is detected during a shutdown operation, the positive main switch is switched and/or if a fault is detected, the operation of the fuel cell system is adjusted, in particular as follows:
- In startup operation, a termination of startup operation of the fuel cell system;
- In shutdown operation, an electrically protected shutdown of the fuel cell system;
- After a shutdown operation, preventing the fuel cell system from restarting.

20. Test device according to claim 12, wherein an insulation check is carried out after comparing the voltage difference detected, especially if a fault is detected.

* * * * *